(12) United States Patent
Pawlak et al.

(10) Patent No.: US 9,419,154 B2
(45) Date of Patent: Aug. 16, 2016

(54) INTERDIGITATED ELECTRODE FORMATION

(71) Applicant: IMEC, Leuven (BE)

(72) Inventors: Bartlomiej Jan Pawlak, Leuven (BE); Bartlomiej Sojka, Cieszyn (PL)

(73) Assignee: IMEC, Leuven (BE)

( * ) Notice: Subject to any disclaimer, the term of this patent is extended or adjusted under 35 U.S.C. 154(b) by 264 days.

(21) Appl. No.: 14/172,688

(22) Filed: Feb. 4, 2014

(65) Prior Publication Data

US 2014/0174526 A1    Jun. 26, 2014

Related U.S. Application Data

(63) Continuation of application No. PCT/EP2012/065009, filed on Aug. 1, 2012.

(60) Provisional application No. 61/515,253, filed on Aug. 4, 2011.

(51) Int. Cl.
  *H01L 31/02*   (2006.01)
  *H01L 31/0224* (2006.01)
  *H01L 31/068*  (2012.01)

(52) U.S. Cl.
  CPC ...... *H01L 31/022458* (2013.01); *H01L 31/022441* (2013.01); *H01L 31/0682* (2013.01); *Y02E 10/547* (2013.01)

(58) Field of Classification Search
  None
  See application file for complete search history.

(56) References Cited

U.S. PATENT DOCUMENTS

| | | | |
|---|---|---|---|
| 6,544,865 B1 | 4/2003 | Basore et al. | |
| 8,900,891 B2 * | 12/2014 | Pawlak | H01L 31/1804 257/53 |
| 2004/0200520 A1 | 10/2004 | Mulligan et al. | |
| 2007/0151598 A1 | 7/2007 | De Ceuster et al. | |

(Continued)

FOREIGN PATENT DOCUMENTS

| | | |
|---|---|---|
| EP | 2 184 787 A1 | 5/2010 |
| JP | 2008311291 | 12/2008 |

(Continued)

OTHER PUBLICATIONS

International Search Report and Written Opinion for International Application No. PCT/EP2012/065009, mailed on Sep. 24, 2012 in 11 pages.

*Primary Examiner* — Seahvosh Nikmanesh
(74) *Attorney, Agent, or Firm* — Knobbe, Martens, Olson & Bear LLP

(57) ABSTRACT

The disclosed technology generally relates to photovoltaic devices and methods of fabricating photovoltaic devices, and more particularly relates to interdigitated back contact photovoltaic cells and methods of fabricating the same. In one aspect, a method of forming first and second interdigitated electrodes on a semiconductor substrate comprises providing a dielectric layer on the rear surface of the semiconductor substrate. The method additionally comprises providing a metal seed layer on the dielectric layer. The method additionally comprises patterning the metal seed layer by laser ablation, thereby separating it into a first seed layer and a second seed layer with a separation region interposed therebetween, wherein the first seed layer and the second seed layer are interdigitated and electrically isolated from each other. The method further comprises thickening the first seed layer and the second seed layer by plating, thereby forming the first electrode and the second electrode.

15 Claims, 5 Drawing Sheets

(56) References Cited

U.S. PATENT DOCUMENTS

| | | |
|---|---|---|
| 2008/0035198 A1 | 2/2008 | Teppe et al. |
| 2010/0059109 A1 | 3/2010 | Nakayashiki et al. |
| 2010/0108130 A1 | 5/2010 | Ravi |
| 2010/0154876 A1* | 6/2010 | Camalleri ............ H01L 31/182 136/255 |
| 2010/0319767 A1 | 12/2010 | Sauar |

FOREIGN PATENT DOCUMENTS

| | | |
|---|---|---|
| JP | 2010205839 | 9/2010 |
| JP | 2011061020 | 3/2011 |
| WO | WO 2013/017616 A1 | 2/2013 |

* cited by examiner

INTERDIGITATED ELECTRODE FORMATION

CROSS REFERENCE TO RELATED APPLICATIONS

This application is a continuation of PCT Application No. PCT/EP2012/065009, filed Aug. 1, 2012, which claims priority under 35 U.S.C. §119(e) to U.S. provisional patent application 61/515,253 filed on Aug. 4, 2011. Each of the above applications is incorporated herein by reference in its entirety.

BACKGROUND OF THE INVENTION

Field of the Invention

The disclosed technology generally relates to methods of fabricating photovoltaic devices, and more particularly relates to methods of fabricating interdigitated back contact photovoltaic cells. Description of the Related Technology Interdigitated back contact (IBC) photovoltaic cells have both the emitter and the base contacts at the rear side of the cell. In these devices, the electron-hole pairs are generated in a high-lifetime bulk region and are collected at interdigitated junctions at the rear side of the cell. With both the p-type contacts and the n-type contacts at the rear side of the cell, there can be no metal pattern on the front side such that light shadowing is reduced. Also, since a substantial part of the back surface can be covered with the metal patterns, the series resistance of the metal patterns can be very low. A substantial part of the back surface being covered with a metal pattern can also help reflect light incident on the metal pattern at the back side of the cell, which can enable multiple light passes across the cell. Therefore the area of the non-metalized region (separation region) between the p-type contacts and the n-type contacts can be minimized. Furthermore, as there is no need to conduct the current along the emitter as with front-contacted cells, there may be less of a need for making a trade-off between series resistance and grid shading.

Industrial manufacturing of interdigitated back contact (IBC) photovoltaic cells is challenging due to the complex cell architecture, which requires the formation of interdigitated n-type regions and p-type regions at the rear side, and the formation of an interdigitated electrode pattern at the rear side without electrical shorts and/or shunts.

In one industrial process for manufacturing interdigitated back contact (IBC) photovoltaic cells, after forming p-type regions and n-type regions at the rear side of a silicon substrate, a dielectric layer is provided on the rear surface, and the dielectric layer is patterned, e.g. by laser ablation, for forming metal contact openings. The interdigitated electrode pattern can then be formed by: providing a metal seed layer at the rear surface; patterning the seed layer, e.g. by laser ablation, thereby defining a separation region between both electrodes; and thickening both electrodes by plating, such as e.g. Cu electroplating. In such a process, there is a challenge in performing the laser ablation of the metal seed layer without metal penetration into the underlying silicon and in addition obtaining a good electrical isolation between both electrodes. Penetration of (laser-ablated) metal into the silicon substrate would result in lifetime degradation of the silicon substrate. Laser ablation thermally evaporates the thin metal seed layer and may lead to metal redeposition on the dielectric layer, in particular in the separation region, thus creating electric shorts between the electrodes.

In US 2008/0035198 a method is described comprising: forming on the dielectric layer at the rear side of the silicon substrate a stack comprising a metal layer and an etch barrier layer such as a polymer layer; low power laser ablation to pattern the barrier layer; and metal etching in the open areas to separate the electrodes. It is an advantage of this method that the risk of silicon damage and lifetime degradation is reduced because of the low-power laser processing. However, it is a disadvantage that the process complexity is increased because of the need for deposition and patterning of an additional etch barrier layer.

SUMMARY OF CERTAIN INVENTIVE ASPECTS

It is an object of embodiments of the present invention to provide a method of forming interdigitated electrodes on a semiconductor substrate with a good electrical isolation between the interdigitated electrodes, wherein the risk of metal penetration into the underlying semiconductor is reduced, and wherein the process complexity is reduced as compared to prior-art methods.

Embodiments of the present invention relate to a method for forming a first electrode and a second electrode on a semiconductor substrate, the first electrode and the second electrode being interdigitated, the method comprising: providing a dielectric layer on a surface of the semiconductor substrate; providing a metal seed layer on the dielectric layer; patterning the metal seed layer by laser ablation, thereby separating the metal seed layer into a first seed layer and a second seed layer with a separation region in between, the first seed layer and the second seed layer being interdigitated and electrically isolated from each other; and thickening the first seed layer and the second seed layer by plating, such as e.g. Cu electroplating, thereby forming the first electrode and the second electrode, wherein before thickening of the first seed layer and the second seed layer the dielectric layer is partially removed in the separation region.

The semiconductor substrate can, for example. comprise a crystalline silicon substrate or a crystalline germanium substrate.

Methods according to embodiments disclosed herein can further comprise patterning the dielectric layer, in such a way as to remove the dielectric layer at locations where electrical contacts may be formed to the underlying semiconductor substrate, such as an electrical contact between the first electrode and a first region of the semiconductor substrate and/or between the second electrode and a second region of the semiconductor substrate. For example, the first region of the semiconductor substrate can be an emitter region of a photovoltaic cell and the second region of the semiconductor substrate can be a back surface field (BSF) region of a photovoltaic cell, or the first region of the semiconductor substrate can be a back surface field (BSF) region of a photovoltaic cell and the second region of the semiconductor substrate can be an emitter region of a photovoltaic cell.

In embodiments of the present invention the dielectric layer is patterned to allow contacts to the semiconductor substrate, in particular the emitter and BSF regions, but it remains at locations corresponding to the separation region.

The dielectric layer can for example be or include a $SiO_x$ layer, a $SiN_x$ layer, an $AlO_x$ layer or any other suitable dielectric layer known to a person skilled in the art. The thickness of this layer can for example be in the range between about 80 nm and 1000 nm, for example between about 80 nm and 500 nm, for example about between 80 nm and 300 nm. The dielectric layer can be a stack of dielectric layers, such as for example a stack comprising a silicon oxide layer and a silicon nitride layer or for example a stack comprising an aluminum oxide layer and a silicon nitride layer or any other suitable dielectric layer stack known to a person skilled in the art. In embodiments of the present invention the dielectric layer can be selected to be a good surface passivation layer reducing recombination of charge carriers at the underlying semiconductor surface.

The metal seed layer may comprise a layer or a stack of layers, such as for example a stack comprising a contact metal layer providing good reflection (such as e.g. an AlSi1% layer having a thickness in the range between about 20 nm and 50 nm), a diffusion barrier metal layer (such as e.g. a TiN layer or a Ti layer having a thickness in the range between about 20 nm and 50 nm), and a conduction metal layer (such as e.g. an about 100 nm to 300 nm thick Cu layer).

The separation region between the first seed layer and the second seed layer can for example have a lateral size in the range between about 20 micrometer and 300 micrometer, for example between about 30 micrometer and 100 micrometer. The lateral size corresponds to the smallest distance between the first seed layer and the second seed layer. For example, if the first seed layer and the second seed layer are finger-shaped and interdigitated, the lateral size of the separation region corresponds to a distance in a direction substantially orthogonal to the longitudinal direction of the fingers of the first seed layer and the second seed layer.

Partially removing the dielectric layer in the separation region can be done by wet etching, for example in a buffered HF solution or for example in a HF solution comprising 0.5% to 5% HF, e.g. about 2% HF. Partially removing the dielectric layer in the separation region can for example comprise removing an about 10 nm to 50 nm thick layer from the dielectric layer, thus leaving a thinner dielectric layer in the separation region.

Embodiments of the present invention can advantageously be used for the fabrication of interdigitated back contact (IBC) cells. It is an advantage of a method according to embodiments disclosed herein that the risk of electrical shorts between both electrodes at the rear side of the IBC cell is reduced as compared to prior-art methods, because in case of metal redeposition on the dielectric layer due to the seed layer laser ablation process, the wet etching used for partially removing the dielectric layer in the separation region also removes such redeposited metal traces, thus reducing the risk of electrical shorts especially after thickening the seed layers. It can be an advantage of a method according to embodiments disclosed herein that the risk of electrical shorts can be reduced with a single additional wet etching step, such that there is only a limited increase in process complexity, as compared to prior-art solutions.

It is an advantage of embodiments of the present invention that lower laser powers can be used for the metal seed layer ablation step as compared to prior-art methods, because it does not have to be ensured that every vestige of the seed layer is removed by the laser ablation step; the lower laser power reduces the risk of damaging the semiconductor, e.g. silicon, substrate and/or reducing the risk of metal penetration into the substrate.

It is known to use laser ablation at different stages of a fabrication process of IBC cells, such as for the definition of emitter regions at the rear side of the cells and for the creation of openings through a dielectric layer at the rear side to allow contacting of the underlying silicon. It is an advantage of a method according to embodiments of the present disclosure that an additional process step, i.e. the seed layer isolation step (separation step), is done by laser ablation. Thus, using a method in accordance with the present invention, all patterning (i.e. steps involving alignment or positioning of features, or the application of masks) at the rear side of the cell can be done on the same type of tool and using the same type of process, thus offering easier alignment between the different process steps.

Thus the present invention aims to provide a method for forming interdigitated electrodes, e.g. for interdigitated back contact photovoltaic cells, wherein a good electrical isolation between the electrodes is obtained, without damaging the underlying semiconductor, e.g. silicon, substrate with a reduced risk of metal penetration into the semiconductor, e.g. silicon, substrate and with a process that is less complex than prior art processes.

Certain objects and advantages of various inventive aspects have been described herein above. Of course, it is to be understood that not necessarily all such objects or advantages may be achieved in accordance with any particular embodiment. Thus, for example., those skilled in the art will recognize that the invention may be embodied or carried out in a manner that achieves or optimizes one advantage or group of advantages as taught herein without necessarily achieving other objects or advantages as may be taught or suggested herein. Further, it is understood that this summary is merely an example and is not intended to limit the scope of the invention. The invention, both as to organization and method of operation, together with features and advantages thereof, may best be understood by reference to the following detailed description when read in conjunction with the accompanying drawings.

Figure 1:
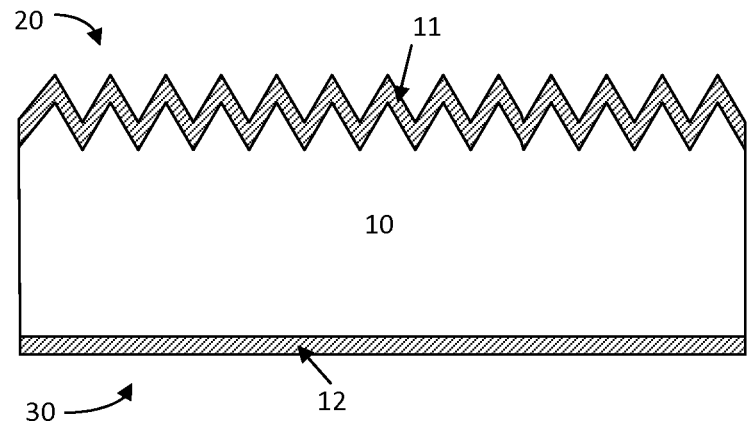
FIGS. 1-9 schematically illustrate intermediate structures of photovoltaic cell at various stages of fabrication, according to various embodiments.

Any reference signs in the claims shall not be construed as limiting the scope of the present invention.

In the different drawings, the same reference signs refer to the same or analogous elements.

DETAILED DESCRIPTION OF CERTAIN ILLUSTRATIVE EMBODIMENTS

In the following detailed description, numerous specific details are set forth in order to provide a thorough understanding of the invention and how it may be practiced in particular embodiments. However, it will be understood that the present invention may be practiced without these specific details. In other instances, well-known methods, procedures and techniques have not been described in detail, so as not to obscure the present invention. While the present invention will be described with respect to particular embodiments and with reference to certain drawings, the invention is not limited hereto. The drawings included and described herein are schematic and are not limiting the scope of the invention. It is also noted that in the drawings, the size of some elements may be exaggerated and, therefore, not drawn to scale for illustrative purposes.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein may be capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as always being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

In the context of the present invention, the front surface or front side of a photovoltaic cell or of a substrate is the surface or side adapted for being oriented towards a light source and thus for receiving illumination. The back surface, rear surface, back side or rear side of a photovoltaic cell or of a substrate is the surface or side opposite to the front surface or side.

In the context of the present invention, interdigitated means intermingled, interlocked, whereby items from one group and items from another group are alternately present. In particular, the interdigitation relates to the back contacts of a photovoltaic cell. The interdigitated electrodes can for example be comb-shaped or finger-shaped, e.g. comprising a plurality of finger-shaped elements. Advantages of such interdigitated back contacts are a lack of front grid shading loss.

As opposed to prior art methods, in embodiments the laser ablation of the metal seed layer (separation into a first seed layer and a second seed layer) is followed by a partial etching, e.g. wet etching, of the dielectric layer, before thickening the first seed layer and the second seed layer. This etching process also removes seed layer metal residues that may be left after the seed layer ablation. If these metal residues were not removed, there would be a risk that their presence might lead to electrical shorts, especially upon thickening the seed layers by electroplating.

An exemplary method for fabricating IBC photovoltaic cells using a method according to one embodiment is schematically illustrated in FIGS. 1-9, for an exemplary embodiment wherein an n-type silicon substrate is used. However, the present invention is not limited thereto and also p-type silicon substrates or semiconductor substrates other than silicon substrates can be used, such as for example germanium substrates.

Referring to FIG. 1, a silicon substrate 10, for example an n-type silicon substrate 10, e.g., having a doping concentration in the range between about $10^{15}$ cm$^{-3}$ and $10^{16}$ cm$^{-3}$, is provided, according to an embodiment. In some implementations, the front side 20 of the substrate 10 is textured. At the front side of the substrate, a front surface field (FSF) region 11 is formed. The FSF region 11 can be a heavily doped region (e.g., with a doping concentration in the range between about $5\times10^{18}$ cm$^{-3}$ and $5\times10^{19}$ cm$^{-3}$) having the same doping type as the substrate 10. For example, the FSF region 11 can be formed in an n-type silicon substrate 10 by performing a phosphorus diffusion process. In some implementations, a back surface field (BSF) region 12 can be formed at the rear side 30 of the substrate 10 in the same phosphorus diffusion process for forming the FSF region 11.

Figure 2:
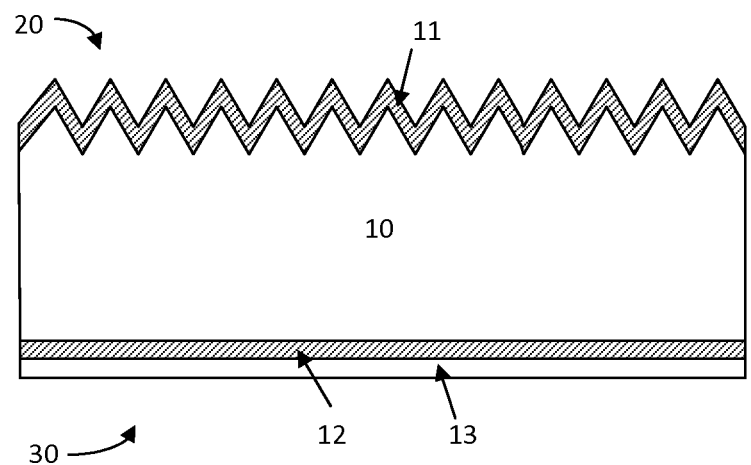

Referring to FIG. 2, after forming the FSF region 11, a first dielectric layer 13 is deposited on the rear surface of the silicon substrate 10, according to an embodiment. The first dielectric layer 13 can have, for example, a thickness in the range between about 80 nm and 300 nm.

Figure 3:
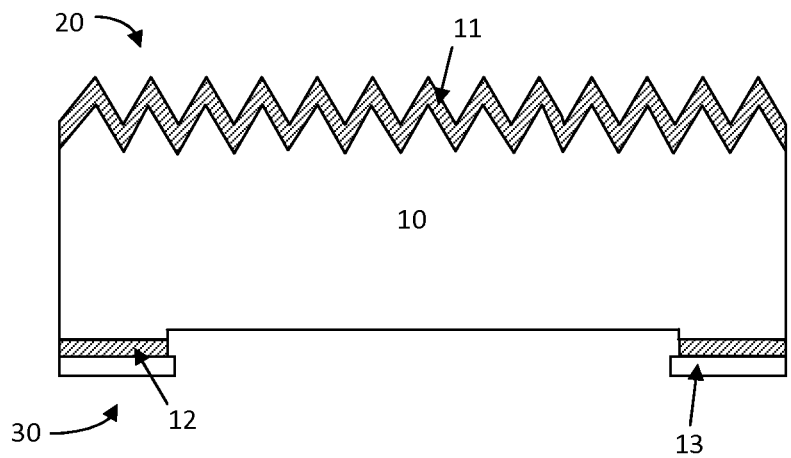

Referring to FIG. 3, after depositing the first dielectric layer 13, the first dielectric layer 13 is then locally removed, according to an embodiment. The first dielectric layer 13 can be removed, e.g., by laser ablation (e.g. pulsed laser ablation), to form exposed regions corresponding to locations where emitter regions are to be formed. In order to obtain a good removal of the dielectric layer, in some embodiments, laser spots can be overlapped during laser ablation, e.g., with area of overlap in the range between about 20% and 60%. This laser ablation process can be followed by a wet etching process for removing a thin silicon layer that may have been damaged during laser ablation and for locally removing the BSF region 12. The etch depth (corresponding to the thickness of the silicon layer that is removed in this process) can be larger than the thickness of the BSF region 12, for example in the range between about 0.5 micrometers and 10 micrometers, or between about 1 micrometer and 5 micrometer, for instance about 2 micrometers.

Still referring to FIG. 3, it will be appreciated that, as in the illustrated embodiment, the amount of the thin silicon layer that is removed from the exposed regions can exceed the thickness of the BSF region 12 such that a vertical sidewall of the substrate 10 is formed under a vertical sidewall of the BSF region 12 in the exposed regions.

Figure 4:
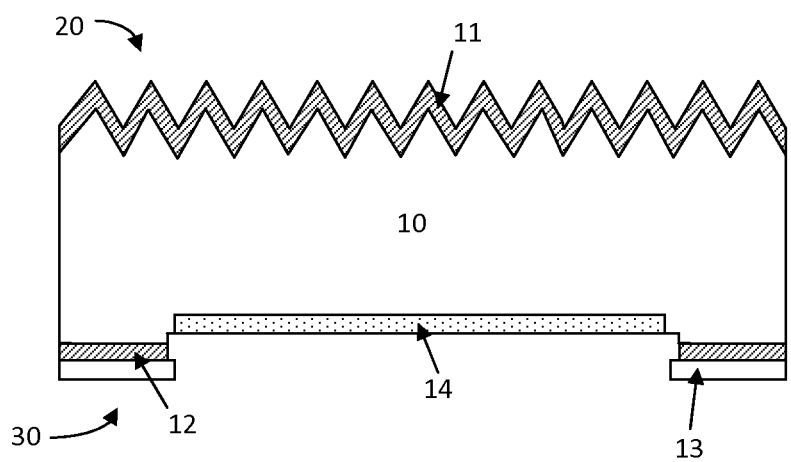

It will be additionally appreciated that, as in the illustrated embodiment, wet-etching to remove the thin silicon layer can additionally remove material laterally to form a recess region under an overhang of the first dielectric layer 13. Referring to FIG. 4, after locally removing the first dielectric layer 13, p-type emitter regions 14 are formed at the rear side 30, according to an embodiment. The p-type emitter regions 14 can be formed, for example, by boron implantation (e.g. using an implant energy in the range between about 2 keV and 20 keV, with a boron dose in the range between about $3\times10^{14}$ cm$^{-2}$ and $3\times10^{15}$ cm$^{-2}$) and subsequent annealing, for example at a temperature in the range between about 950° C. and 1100° C., or by any other suitable method known to a person skilled in the art, using the patterned first dielectric layer 13 as a mask. The first dielectric layer 13 can be removed after the implantation process. Although not illustrated in the drawings, the emitter regions 14 can be in the form of long rectangles or fingers, extending in the direction perpendicular to the page.

It will be appreciated that, as a result of forming the vertical sidewall of the substrate and the recess under the overhang of the first dielectric layer 13 as described with respect to FIG. 3, a separation region can be formed between the emitter regions 14 and the similarly finger-shaped BSF regions 12.

Figure 5:
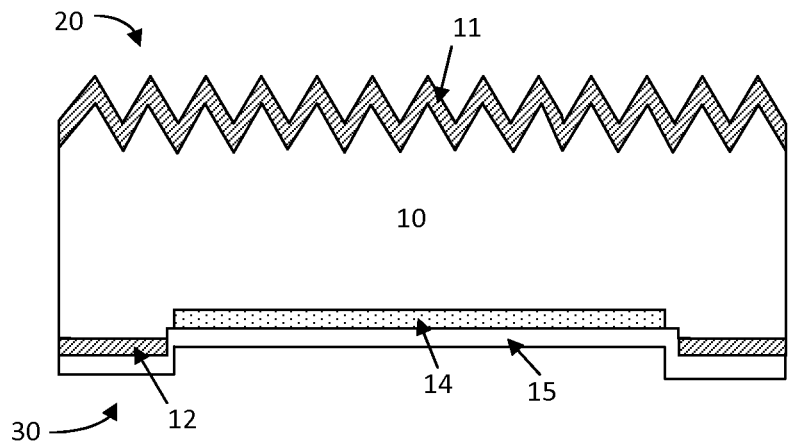

Referring to FIG. 5, after forming the p-type emitter regions 14, a second dielectric layer 15 is formed at the rear side 30, according to an embodiment. In some implementations, the second dielectric layer 15 can comprise a stack of dielectric layers. Under some circumstances, the second dielectric layer 15 can advantageously provide surface passivation and/or provide protection against metal penetration that can occur at a later process or processes. The second dielectric layer 15, which can include a stack of dielectric layers, can for example, comprise a silicon oxide layer and/or a silicon nitride layer and/or other suitable dielectric layer known to a person skilled in the art for passivating or blocking metal penetration. The second dielectric layer 15 can, for example, have a thickness in the range between about 80 nm and 1000 nm, or between about 80 nm and 300 nm. However, the present invention is not limited thereto, and other dielectric layer thicknesses can be used.

Figure 6:
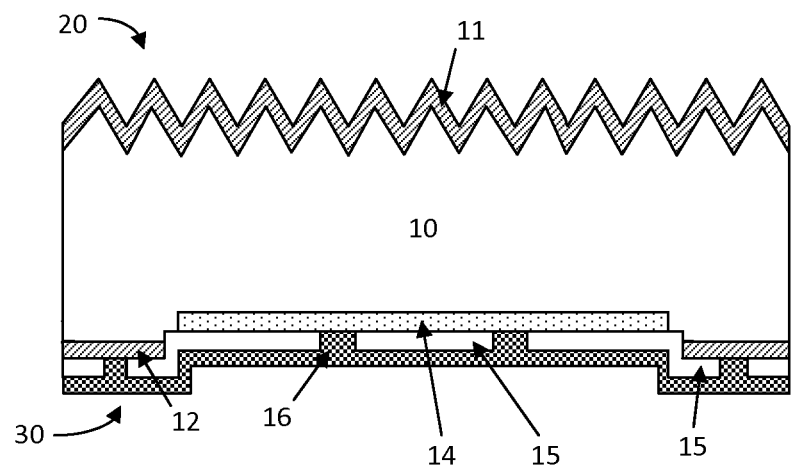

Referring to FIG. 6, after forming the second dielectric layer 15, the second dielectric layer 15 is patterned, according to an embodiment. The second dielectric layer 15 can be patterned, e.g., by laser ablation, thereby forming openings in the second dielectric layer 15, according to an embodiment. The openings can include locations where electrical contacts are to be provided to the silicon (e.g., to the emitter regions 14 and to the BSF regions 12) at a later stage of the process.

Still referring to FIG. 6, after forming the openings in the second dielectric layer 15, a metal seed layer 16 is deposited over the rear side 30 of the substrate, according to an embodiment. The deposited metal seed layer 30 can comprise a layer or a stack of layers. For example, the metal seed layer 30 may comprise a stack including a contact metal layer that may provide good reflection (such as, e.g., an AlSi1% layer having a thickness in the range between about 20 nm and 50 nm), a diffusion barrier metal layer (such as, e.g., a TiN layer or a Ti layer having a thickness range between about 20 nm and 50 nm), and a conduction metal layer (such as, e.g., a Cu layer having a thickness range between about 100 nm and 300 nm). However, the present invention is not limited thereto, and other suitable seed layers or stacks of layers may be used.

Figure 7:
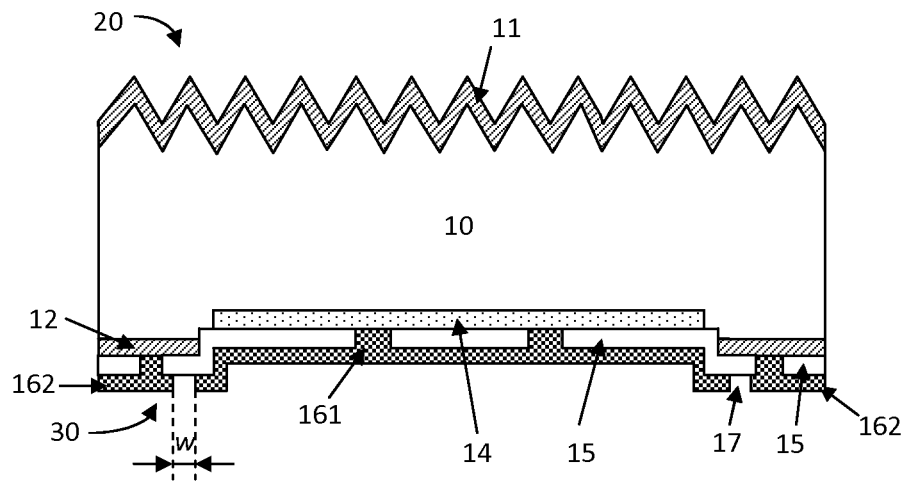

Referring to FIG. 7, after depositing the metal seed layer 16, a laser ablation process is performed to locally remove the seed layer 16 to form openings 17 (separation regions) in the seed layer 16, according to an embodiment, Locally removing the seed layer 16 provides electrically isolated interdigitated seed layers comprising: a first seed layer 161 in electrical contact with emitter regions 14 and a second seed layer 162 in electrical contact with BSF regions 12, where the first seed layer 161 is electrically isolated from the second seed layer 162. The lateral size or width w of the separation regions 17 can, for example, be in the range between about 20 micrometers and 300 micrometers. However, the present invention is not limited thereto and other lateral sizes can be used.

Figure 8:
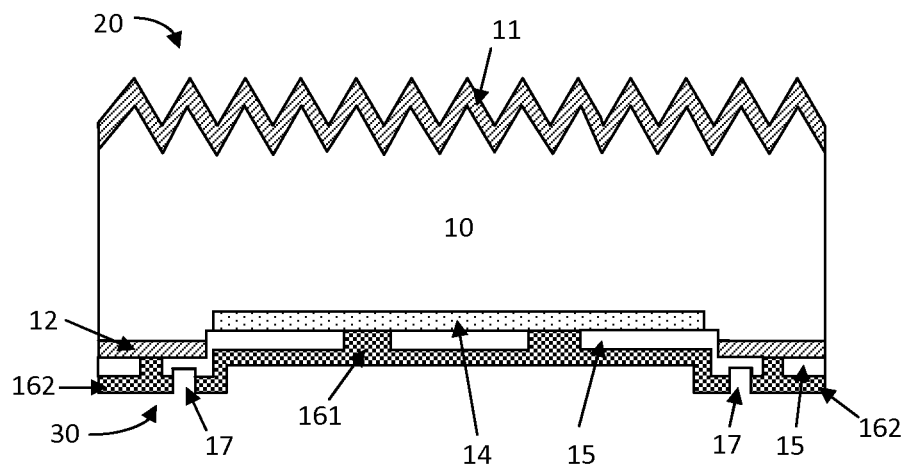

Referring to FIG. 8, after forming openings 17, a wet etching process is performed, thereby partially removing the second dielectric layer 15 at locations where the seed layer has been removed, according to an embodiment. The wet etching process can be performed, for example in buffered HF solution or in a solution comprising about 0.5% to 5% HF. The second dielectric layer 15 can be removed in the separation regions 17. The amount of the second dielectric layer 15 removed can be, for example, about 10 nm to 50 nm. It may be advantageous to partially remove the second dielectric layer 15 at this stage of the process, so that the risk of electrical shorts can be reduced. In case of metal redeposition on the dielectric layer resulting from the seed layer laser ablation process, the wet etching process used for partially removing the second dielectric layer 15 in the separation regions 17 can also remove such redeposited metal traces.

Figure 9:
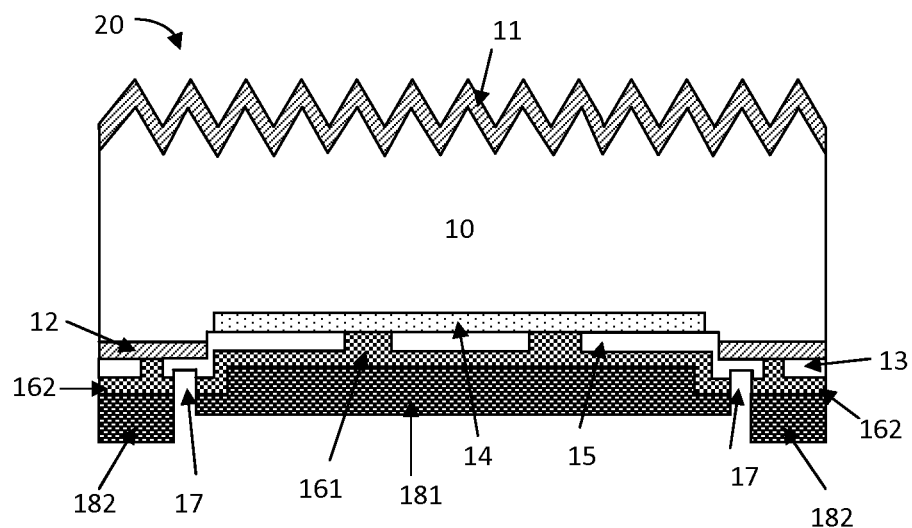

Referring to FIG. 9, after wet etching, the first seed layer 161 and the second seed layer 162 are thickened according to an embodiment. The second see layer 162 can be thickened, for example, by an electroplating process, thus forming an emitter rear side electrode 181 and a bulk rear side electrode 182, where the emitter rear side electrode 181 and the bulk rear side electrode 182 being interdigitated and electrically isolated from each other. For example, a Cu layer having a thickness in the range between about 10 micrometer and 50 micrometer (depending on cell dimensions) can be provided by electroplating.

It is an advantage of the IBC fabrication process illustrated in FIGS. 1-9 that laser ablation is used for three different patterning processes at the rear side: removal of the first dielectric layer at the rear side for defining emitter regions; providing openings through the second dielectric layer at the location of metal contacts; and laser ablation of the metal seed layer to create a separation region between both interdigitated electrodes. It is an advantage of such a fabrication process that all patterning can be done on the same type of tool and using the same type of process, thus offering easier cross-alignment between processes.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention.

What is claimed is:

1. A method of forming a first electrode and a second electrode on a semiconductor substrate, the first electrode and the second electrode being interdigitated, the method comprising:
providing a dielectric layer on a surface of the semiconductor substrate;
providing a metal seed layer on the dielectric layer;
patterning the metal seed layer by laser ablation, thereby separating the metal seed layer into a first seed layer and a second seed layer interposed by a separation region formed therebetween, wherein the first seed layer and the second seed layer are interdigitated and electrically isolated from each other; and
thickening the first seed layer and the second seed layer by plating, thereby forming the first electrode and the second electrode,
wherein before thickening of the first seed layer and the second seed layer, the dielectric layer is partially removed from the separation region.

2. The method of claim 1, wherein the dielectric layer is partially removed by a process not including the laser ablation.

3. The method of claim 2, wherein the dielectric layer is partially removed from the separation region by wet etching in a solution comprising HF.

4. The method of claim 1, wherein the dielectric layer is partially removed from the separation region to reduce the thickness by about 10 nm to 50 nm.

5. The method of claim 1, wherein the thickening of the first seed layer and the second seed layer by plating comprises Cu electroplating.

6. The method of claim 1, wherein the dielectric layer has a thickness in the range between about 80 nm and 1000 nm.

7. The method of claim 1, further comprising patterning the dielectric layer before providing the metal seed layer, wherein patterning the dielectric layer comprises removing the dielectric layer from a location configured for forming an electrical contact to the underlying semiconductor substrate at a later process.

8. The method of claim 7, wherein removing the dielectric layer comprises removing from a plurality of locations configured for forming an electrical contact, wherein one of the locations is between the first electrode and a first region of the semiconductor substrate, and wherein another one of the locations is between the second electrode and a second region of the semiconductor substrate.

9. The method of claim 8, wherein the first region comprises an emitter region of a photovoltaic cell, and wherein the second region comprises a back surface field (BSF) region of the photovoltaic cell.

10. The method of claim 1, wherein the dielectric layer comprises at least one of $SiO_x$, $SiN_x$ and $AlO_x$.

11. The method of claim 1, wherein the metal seed layer comprises a stack of metal layers.

12. The method of claim 11, wherein the stack of metal layers includes a contact metal layer, a diffusion barrier metal layer and a conduction metal layer.

13. The method of claim 12, wherein the contact metal layer and the diffusion barrier metal layer have a thickness in the range between about 20 nm and 50 nm, and wherein the conduction metal layer has a thickness in the range between about 100 nm and 300 nm.

14. The method of claim 1, wherein the separation region between the first seed layer and the second seed layer has a lateral dimension in the range between about 20 micrometers and 300 micrometers.

15. A method of fabricating an interdigitated back-contact photovoltaic cell comprising the method of forming a first electrode and a second electrode of claim 1.

* * * * *